United States Patent
Huang et al.

(10) Patent No.: US 11,217,555 B2
(45) Date of Patent: Jan. 4, 2022

(54) ALIGNING BUMPS IN FAN-OUT PACKAGING PROCESS

(71) Applicant: Taiwan Semiconductor Manufacturing Company, Ltd., Hsinchu (TW)

(72) Inventors: Ying-Jui Huang, Zhubei (TW); Chien Ling Hwang, Hsinchu (TW); Chih-Wei Lin, Zhubei (TW); Ching-Hua Hsieh, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/966,468

(22) Filed: Apr. 30, 2018

(65) Prior Publication Data
US 2019/0103375 A1  Apr. 4, 2019

Related U.S. Application Data

(60) Provisional application No. 62/565,446, filed on Sep. 29, 2017.

(51) Int. Cl.
*H01L 23/00* (2006.01)
*H01L 23/538* (2006.01)
(Continued)

(52) U.S. Cl.
CPC .......... *H01L 24/73* (2013.01); *H01L 21/4853* (2013.01); *H01L 21/4857* (2013.01);
(Continued)

(58) Field of Classification Search
CPC ... H01L 24/11; H01L 24/16; H01L 24/18–25; H01L 24/73; H01L 24/76;
(Continued)

(56) References Cited

U.S. PATENT DOCUMENTS

| 6,593,168 B1 * | 7/2003 | Ehrichs | H01L 23/544 |
| | | | 257/797 |
| 8,378,472 B2 | 2/2013 | Matsuno et al. | |

(Continued)

FOREIGN PATENT DOCUMENTS

| CN | 101836293 A | 9/2010 |
| CN | 104037153 A | 9/2014 |

(Continued)

*Primary Examiner* — Khiem D Nguyen
*Assistant Examiner* — Gardner W. S. Swan
(74) *Attorney, Agent, or Firm* — Slater Matsil, LLP

(57) ABSTRACT

A method includes placing a first package component and a second package component over a carrier. The first conductive pillars of the first package component and second conductive pillars of the second package component face the carrier. The method further includes encapsulating the first package component and the second package component in an encapsulating material, de-bonding the first package component and the second package component from the carrier, planarizing the first conductive pillars, the second conductive pillars, and the encapsulating material, and forming redistribution lines to electrically couple to the first conductive pillars and the second conductive pillars.

20 Claims, 26 Drawing Sheets

(51) Int. Cl.
*H01L 21/48* (2006.01)
*H01L 21/56* (2006.01)
*H01L 23/31* (2006.01)
*H01L 21/683* (2006.01)

(52) U.S. Cl.
CPC ......... *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 23/5389* (2013.01); *H01L 24/16* (2013.01); *H01L 24/19* (2013.01); *H01L 24/20* (2013.01); *H01L 24/97* (2013.01); *H01L 2221/68345* (2013.01); *H01L 2221/68359* (2013.01); *H01L 2221/68368* (2013.01); *H01L 2224/04105* (2013.01); *H01L 2224/10135* (2013.01); *H01L 2224/12105* (2013.01); *H01L 2224/16227* (2013.01); *H01L 2224/16235* (2013.01); *H01L 2224/214* (2013.01); *H01L 2224/24137* (2013.01); *H01L 2224/73209* (2013.01); *H01L 2224/96* (2013.01); *H01L 2924/18162* (2013.01)

(58) Field of Classification Search
CPC ..... H01L 24/82; H01L 24/95; H01L 23/3157; H01L 23/3185; H01L 23/3128; H01L 23/3135; H01L 23/5389; H01L 23/5386; H01L 23/5383; H01L 23/488; H01L 21/565; H01L 21/563; H01L 21/568; H01L 21/4853; H01L 21/4857; H01L 21/56; H01L 2224/04105; H01L 2224/12105; H01L 2224/24137; H01L 2224/96; H01L 2224/16227; H01L 2224/214; H01L 2224/16235; H01L 2224/10135; H01L 2224/73209; H01L 2221/68345; H01L 2221/68359; H01L 2221/68368; H01L 2924/18162
USPC ....................................................... 257/668
See application file for complete search history.

(56) References Cited

U.S. PATENT DOCUMENTS

| | | | |
|---|---|---|---|
| 9,589,842 B2 | 3/2017 | Choi et al. | |
| 9,741,689 B2 | 8/2017 | Chang et al. | |
| 10,504,827 B2 | 12/2019 | Baloglu et al. | |
| 2004/0036179 A1* | 2/2004 | Chiu | H01L 21/563 257/778 |
| 2008/0099925 A1* | 5/2008 | Irsigler | H01L 21/563 257/778 |
| 2010/0038780 A1* | 2/2010 | Daubenspeck | H01L 24/97 257/738 |
| 2010/0224398 A1* | 9/2010 | Matsuno | H01L 21/563 174/260 |
| 2013/0122655 A1 | 5/2013 | Yu et al. | |
| 2014/0077362 A1* | 3/2014 | Lin | H01L 23/5384 257/737 |
| 2015/0255416 A1* | 9/2015 | Kim | H01L 23/3157 257/773 |
| 2016/0172287 A1 | 6/2016 | Arisaka et al. | |
| 2016/0276235 A1* | 9/2016 | Chen | H01L 23/481 |
| 2017/0323866 A1* | 11/2017 | Shih | H01L 23/5385 |

FOREIGN PATENT DOCUMENTS

| | | |
|---|---|---|
| CN | 205944075 U | 2/2017 |
| KR | 20160094548 A | 8/2016 |

\* cited by examiner

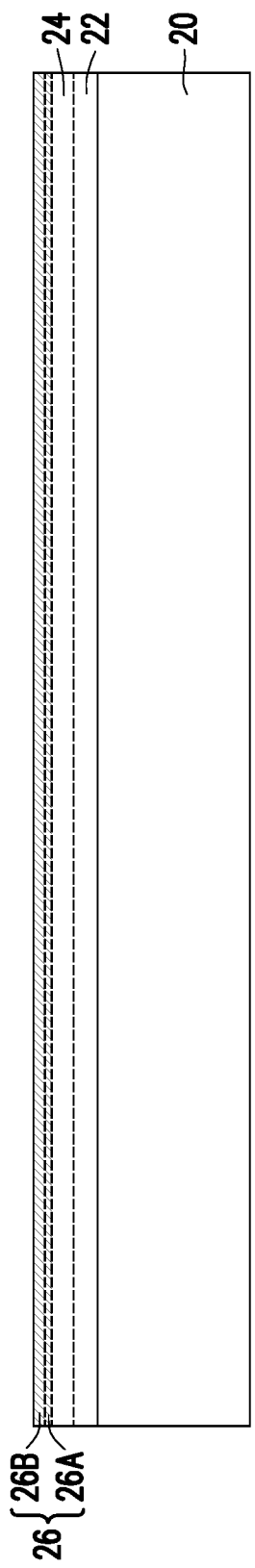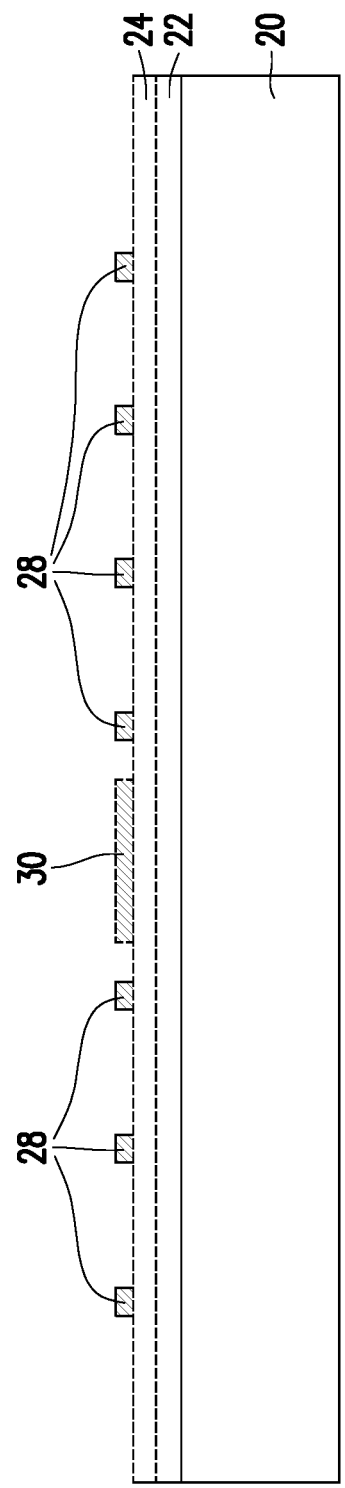

ALIGNING BUMPS IN FAN-OUT PACKAGING PROCESS

PRIORITY CLAIM AND CROSS-REFERENCE

This application claims the benefit of the following provisionally filed U.S. patent application: Application Ser. No. 62/565,446, filed Sep. 29, 2017, and entitled "Aligning Bumps in Fan-Out Packing process;" which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 14 illustrate the cross-sectional views of intermediate stages in the formation of a package in accordance with some embodiments.

DETAILED DESCRIPTION

Figure 3:
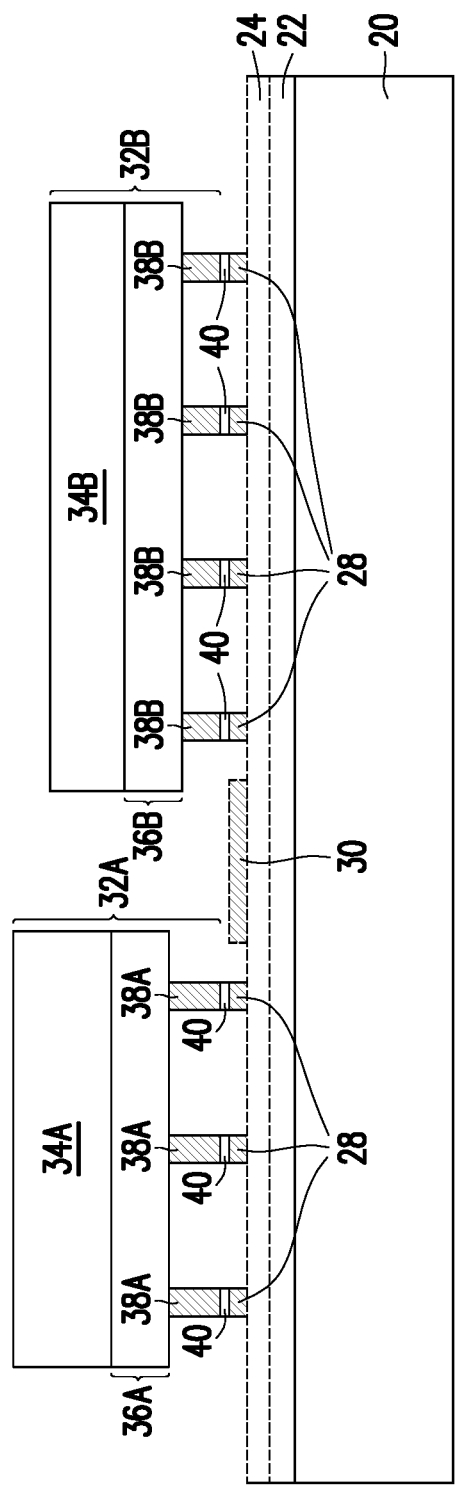

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated Fan-Out (InFO) packages and the methods of forming the same are provided in accordance with various exemplary embodiments. The intermediate stages of forming the InFO packages are illustrated in accordance with some embodiments. Some variations of some embodiments are discussed. Throughout the various views and illustrative embodiments, like reference numbers are used to designate like elements.

Figure 26:
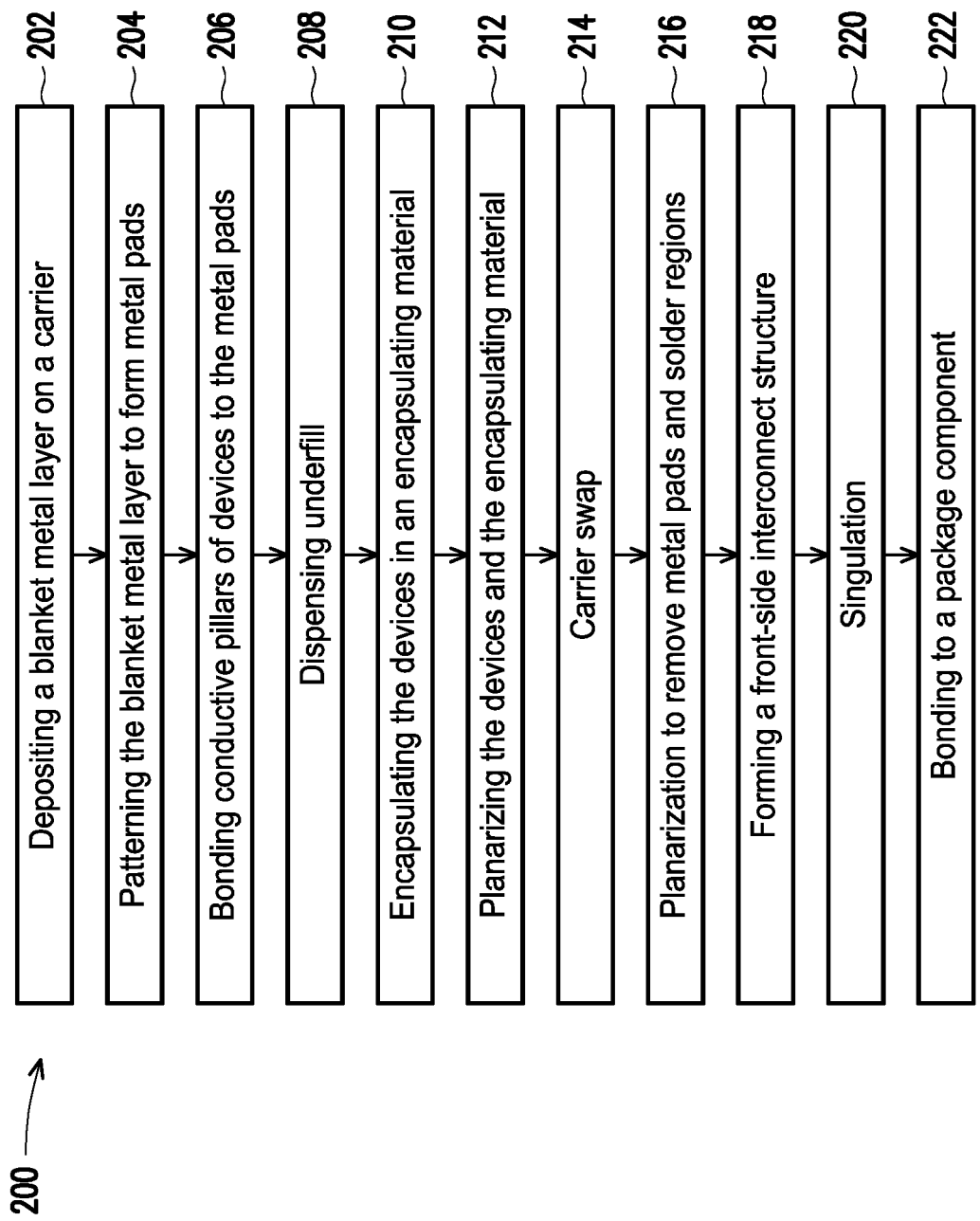
FIGS. 26 and 27 illustrate process flows for forming packages in accordance with some embodiments.

FIGS. 1 through 14 illustrate the cross-sectional views of intermediate stages in the formation of a package in accordance with some embodiments. The steps shown in FIG. 1 through 14 are also illustrated schematically in the process flow 200 shown in FIG. 26.

Referring to FIG. 1, carrier 20 is provided, and release film 22 is coated on carrier 20. Carrier 20 is formed of a transparent material, and may be a glass carrier, a ceramic carrier, an organic carrier, or the like. Carrier 20 may have a round top-view shape, and may have a size of a silicon wafer. For example, carrier 20 may have an 8-inch diameter, a 12-inch diameter, or the like. Release film 22 is in physical contact with the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as laser), and hence can release carrier 20 from the structure formed thereon. In accordance with some embodiments of the present disclosure, LTHC layer 22 includes carbon black (carbon particles), a solvent, a filler, and/or an epoxy. LTHC layer 22 may be coated in a flowable form, and is then cured, for example, under ultra-violet (UV) light.

In accordance with some embodiments, as also shown in FIG. 1, polymer buffer layer 24 is formed on release film 22. In accordance with some embodiments, polymer buffer layer 24 is formed of polybenzoxazole (PBO), polyimide, benzocyclobutene (BCB), or another applicable polymer. In accordance with alternative embodiments of the present disclosure, polymer buffer layer 24 is not formed. Accordingly, polymer buffer layer 24 is illustrated as dashed to indicate it may or may not be formed.

FIG. 1 further illustrates the formation of metal layer 26, which may be performed through deposition. The respective step is shown as step 202 in the process flow shown in FIG. 26. Metal layer 26 may be formed for example, through Physical Vapor Deposition (PVD). In accordance with some embodiments of the present disclosure, there is no dielectric layer formed between LTHC coating 22 and metal layer 26, and hence metal layer 26 is in physical contact with LTHC layer 22. For example, there is no polymer layer such as polyimide layer, polybenzoxazole (PBO) layer, or benzocyclobutene (BCB) layer located between metal layer 26 and LTHC layer 22. In accordance with some embodiments of the present disclosure, metal layer 26 includes titanium layer 26A and copper layer 26B over titanium layer 26A. In accordance with alternative embodiments of the present disclosure, metal layer 26 is a homogenous layer, which may be a copper layer.

Figure 23:
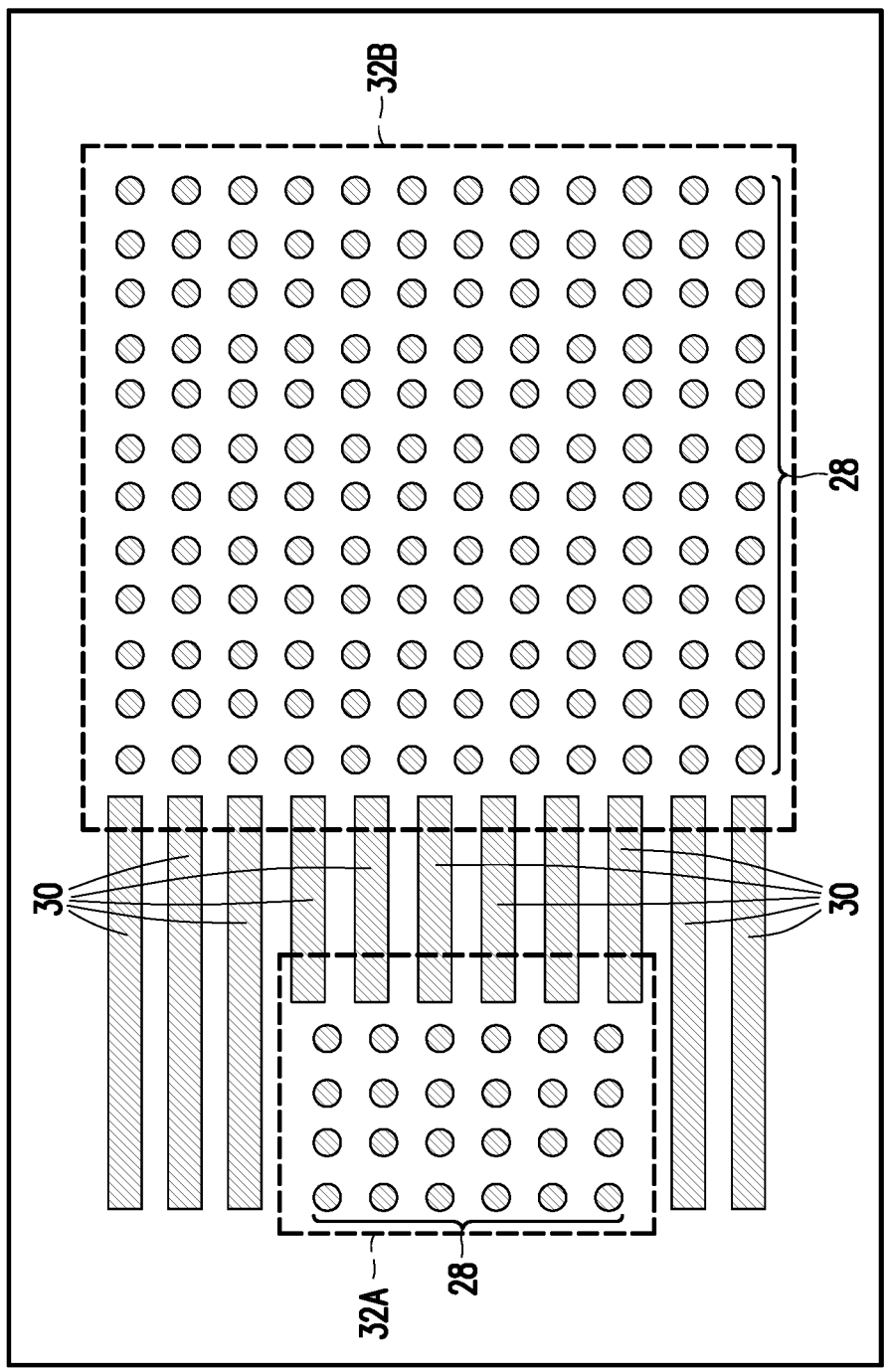
FIG. 23 illustrates a top view of metal pads and guiding strips in accordance with some embodiments.

Reference is now made to FIG. 2. Next, metal layer 26 is patterned through etching, and metal pads 28 are formed. The respective step is shown as step 204 in the process flow shown in FIG. 26. The positions and the sizes of metal pads 28 are determined to match the positions and sizes of the subsequently placed package components 32A and 32B (shown in FIG. 3), so that package components 32A and 32B can be bonded to metal pads 28. In addition to metal pads 28, the remaining portions of metal layer 26 may (or may not) include guiding strips 30, which are elongated strips. FIG. 23 illustrates a top view of some exemplary metal pads 28 and guiding strips 30 in accordance with some embodiments of the present disclosure. As shown in FIG. 23, at least some of guiding strips 30 are located between two groups of metal pads 28, and guiding strips 30 leads from one group to the other. FIG. 23 also schematically illustrates package components 32A and 32B, which are subsequently bonded to metal pads 28 in the step shown in FIG. 3.

In accordance with alternative embodiments of the present disclosure, the formation of metal pads 28 and guiding strips 30 include depositing a blanket metal seed layer, forming and patterning a photo resist to expose some portions of the blanket metal seed layer, plating a metallic material in the openings in the photo resist, removing the photo resist, and etching the portions of the metal seed layer not covered by the photo resist. The remaining portions of the plated metallic material and metal seed layer form metal pads 28 and guiding strips 30.

FIG. 3 illustrates the placement/attachment of package components 32A and 32B, which are also collectively and individually referred to as package components 32 or devices 32. Package components 32A and 32B may include device dies including integrated circuit devices (such as active devices, which include transistors, for example) at the front surface (the surface facing down) of the respective semiconductor substrates 34A and 34B. In accordance with some embodiments of the present disclosure, each of package components 32A and 32B may be a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Each of package components 32A and 32B may also be a System-On-Chip die, a memory die (such as a Static Random Access Memory (SRAM) die or a Dynamic Random Access Memory (DRAM) die), a High-Bandwidth-Memory (HBM) cube, or the like.

Package components 32A and 32B may include semiconductor substrates 34A and 34B, which may also be silicon substrates in accordance with some exemplary embodiments. Package components 32A and 32B may also include interconnect structures 36A and 36B, respectively, and conductive pillars 38A and 38B, respectively. Interconnect structures 36A and 36B may include dielectric layers, and metal lines and vias in the dielectric layers. Conductive pillars 38A and 38B may be metal pillars, and may include copper pillars, which may or may not include additional layers such as nickel layers, gold layers, palladium layers, or the like. Conductive pillars 38A and 38B may have vertical and straight edges, and may protrude below the respective surface dielectric layers in package components 32A and 32B, respectively. Conductive pillars 38A and 38B are pre-formed as portions of package components 32A and 32B, and are electrically coupled to the integrated circuit devices such as transistors in package components 32A and 32B, respectively.

Package components (devices) 32 are bonded to metal pads 28 through solder regions 40, which may be parts of the pre-formed package components 32. The respective step is shown as step 206 in the process flow shown in FIG. 26. The bonding includes an alignment step, a light press on each of package components 32, and a reflow process. The reflow may be performed after all package components 32 are placed, or may be performed for each of package components 32. The positions of conductive pillars 38A and 38B are aligned to the respective metal pads 28. The horizontal sizes of metal pads 28 may be greater than, equal to, or smaller than the horizontal sizes of the respective overlying conductive pillars 38A and 38B. The reflow process is also a self-alignment process since the positions of package components 32A and 32B will be aligned by the molten solder regions 40. Accordingly, as long as metal pads 28 are formed accurately to the intended positions, package components 32A and 32B will be aligned to the intended positions on carrier 20. Also, by placing package components 32A and 32B facing down to allow conductive pillars 38A and 38B to bond to metal pads 28 that are on the same plane, the bottom surfaces of conductive pillars 38A and 38B are aligned to substantially a same horizontal plane.

Since carrier 20 is at wafer level, although one package component 32A and one package component 32B are illustrated, a plurality of identical device dies 32A and a plurality of identical device dies 32B are bonded to the respective metal pads 28. The package components 32A and 32B may be arranged as device groups, each including one package component 32A and one package component 32B. The device groups may be arranged as an array including a plurality of rows and a plurality of columns.

Figure 4:
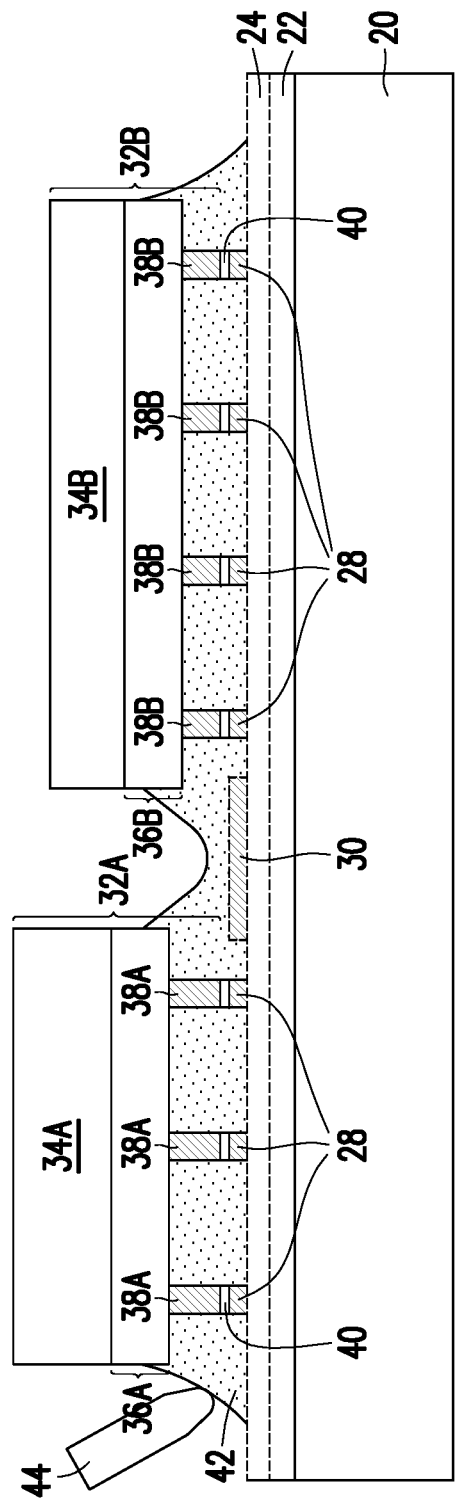

FIG. 4 illustrates the dispensing and the curing of underfill 42. The respective step is shown as step 208 in the process flow shown in FIG. 26. In accordance with some embodiments of the present disclosure, underfill 42 is dispensed by dispenser 44 on one side of the device group including package components 32A and 32B. Underfill 42 then flows into the gap between buffer layer 24 and package component 32A, the gap between package components 32A and 32B, and the gap between buffer layer 24 and package component 32B. Guiding strips 30 have the function of guiding the flow of underfill 42, so that it is easier for underfill 42 to flow through the gap between package components 32A and 32B, and flow into the gap between buffer layer 24 and package component 32B. Without guiding strips 30, underfill 42 is more likely to accumulate in the gap between package components 32A and 32B, and less underfill 42 will flow into the gap between buffer layer 24 and package component 32B.

Underfill 42 may include base material 42A (refer to FIG. 25), which may be a polymer, a resin, an epoxy, or the like, and filler particles 42B in base material 42A. Filler particles 42B may be dielectric particles of $SiO_2$, $Al_2O_3$, silica, or the like, and may have spherical shapes. Also, the spherical filler particles may have a plurality of different diameters. Both filler particles 42B and base material 42A in underfill 42 may be in physical contact with polymer buffer layer 24 (FIG. 4) or LTHC layer 22 if polymer layer 24 is not formed.

Figure 5:
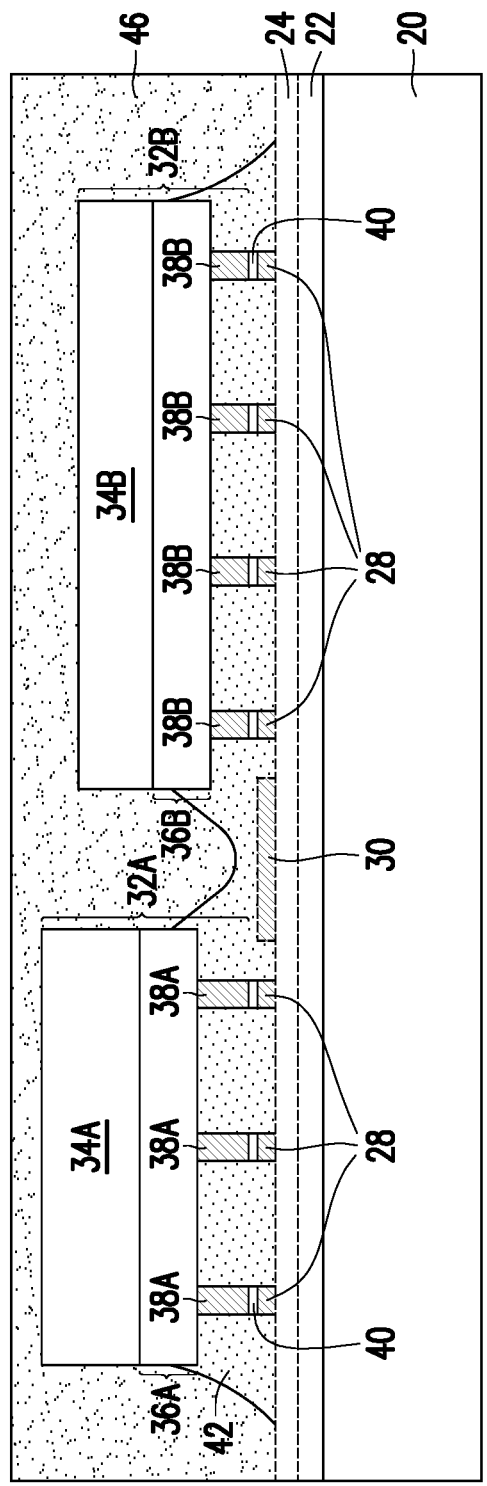
Figure 25:
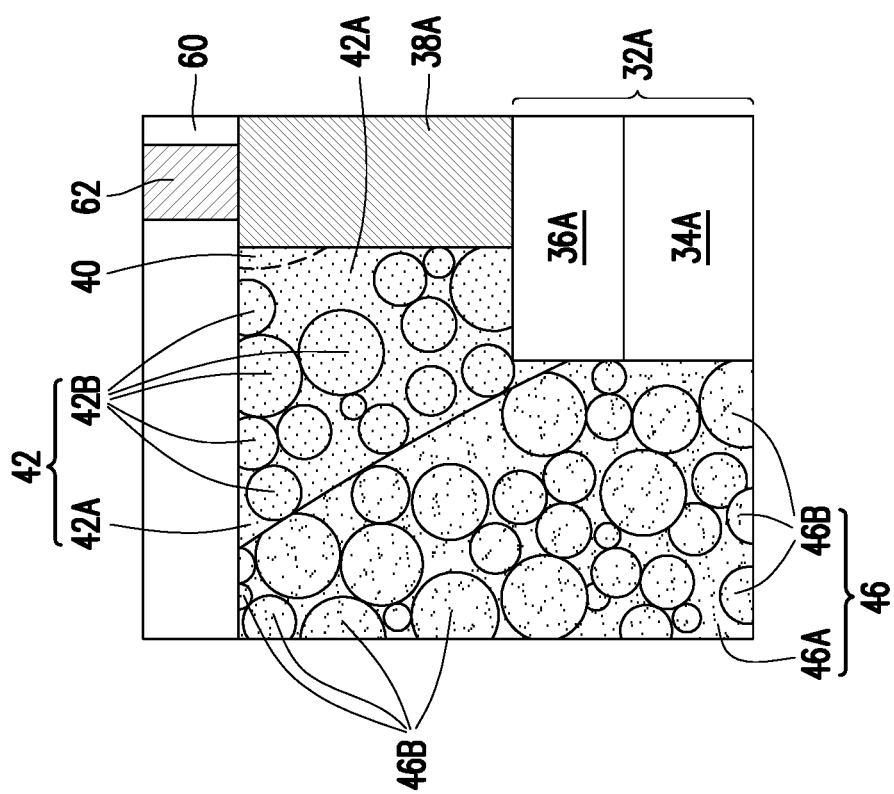
FIG. 25 illustrates an amplified view of a portion of a package including planarized underfill and encapsulating material in accordance with some embodiments.

Next, package components 32A and 32B are encapsulated in encapsulating material 46, as shown in FIG. 5. The respective step is shown as step 210 in the process flow shown in FIG. 26. Encapsulating material 46 fills the gaps between neighboring package components 32A and 32B. Encapsulating material 46 may include a molding compound, a molding underfill, an epoxy, and/or a resin. The top surface of encapsulating material 46 is higher than the top surfaces of both package components 32A and 32B. Encapsulating material 46 may also include base material 46A (FIG. 25), which may be a polymer, a resin, an epoxy, or the like, and filler particles 46B in base material 46A. The filler particles 46B may be dielectric particles of $SiO_2$, $Al_2O_3$, silica, or the like, and may have spherical shapes. Also, the spherical filler particles 46B may have a plurality of different diameters. As shown in FIG. 25 in combination with FIG. 5, both filler particles 46B and base material 46A may be in physical contact with polymer buffer layer 24 or LTHC layer 22 if polymer layer 24 is not formed.

Figure 6:
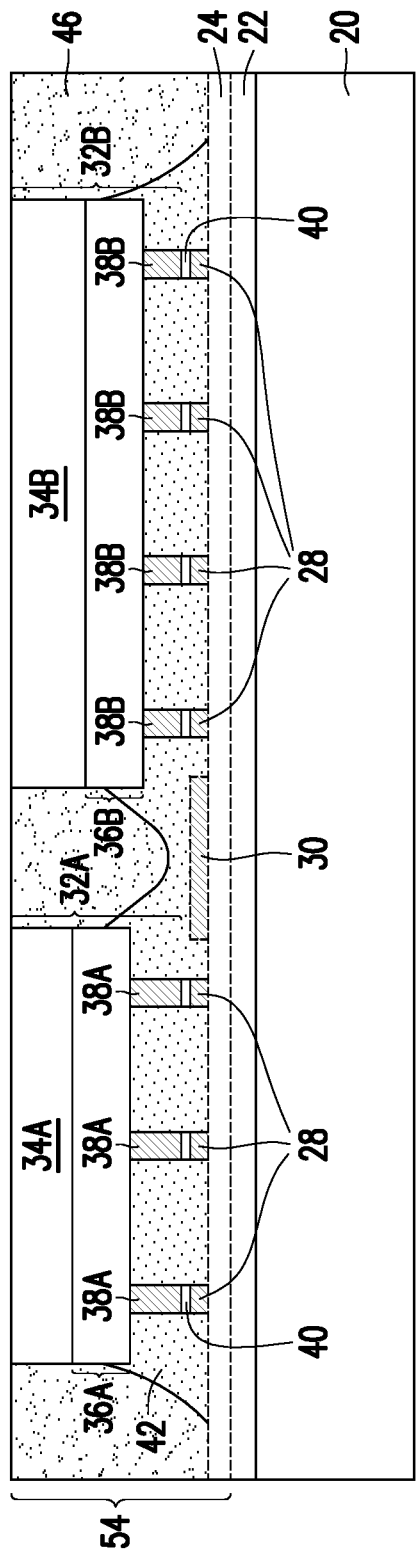

In a subsequent step, as shown in FIG. 6, a planarization step such as a Chemical Mechanical Polish (CMP) step or a mechanical grinding step is performed to thin encapsulating material 46, until one or both of package components 32A and 32B are exposed. The respective step is shown as step 212 in the process flow shown in FIG. 26. In accordance with some embodiments of the present disclosure, substrates 34A and 34B, which may be silicon substrates, are exposed. Due to the planarization process, the top surfaces of package components 32A and 32B are substantially level (coplanar) with the top surfaces of encapsulating material 46. In accordance with alternative embodiments, after the planarization is finished, one of package components 32A and 32B is not exposed, and is covered by a remaining layer of encapsulating material 46 directly over it. Throughout the description, the structure overlying LTHC layer 22 is referred to as composite wafer 54.

Figure 7:
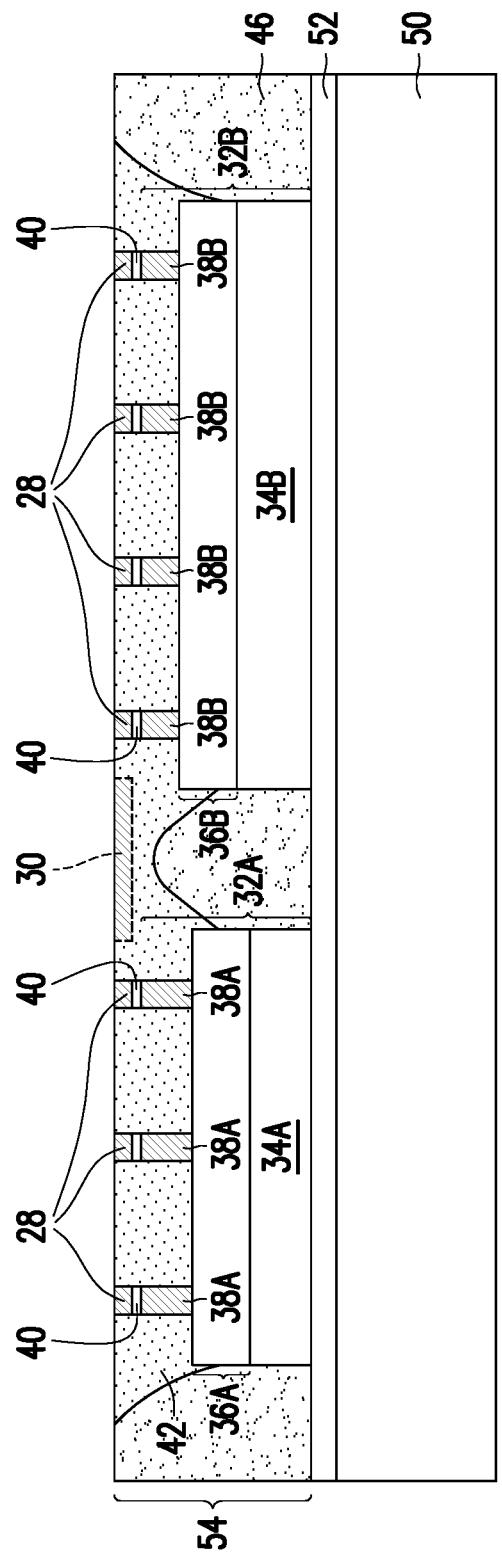

FIG. 7 illustrates a carrier swap. The respective step is shown as step 214 in the process flow shown in FIG. 26. During the carrier swap, carrier 50 is attached to the illustrated surfaces of package components 32A and 32B and encapsulating material 46, for example, through release film 52. Carrier 50 is attached to an opposite side of composite wafer 54 than carrier 20 (FIG. 6). Next, package components 32A and 32B and encapsulating material 46 are demounted from carrier 20 (FIG. 6). In accordance with some embodiments of the present disclosure, the demouting includes decomposing LTHC layer 22, which includes projecting a heat-carrying radiation such as a laser beam on LTHC layer 22. As a result, LTHC layer 22 is decomposed, and carrier 20 may be lifted off from LTHC layer 22. Composite wafer 54 is hence de-bonded (demounted) from carrier 20. The resulting structure is shown in FIG. 7. If composite wafer 54 includes polymer buffer layer 24 (FIG. 6), the polymer buffer layer 24 is also removed, exposing underfill 42 and encapsulating material 46, as also shown in FIG. 7. Metal pads 28 and guiding strips 30 are thus exposed.

Figure 8:
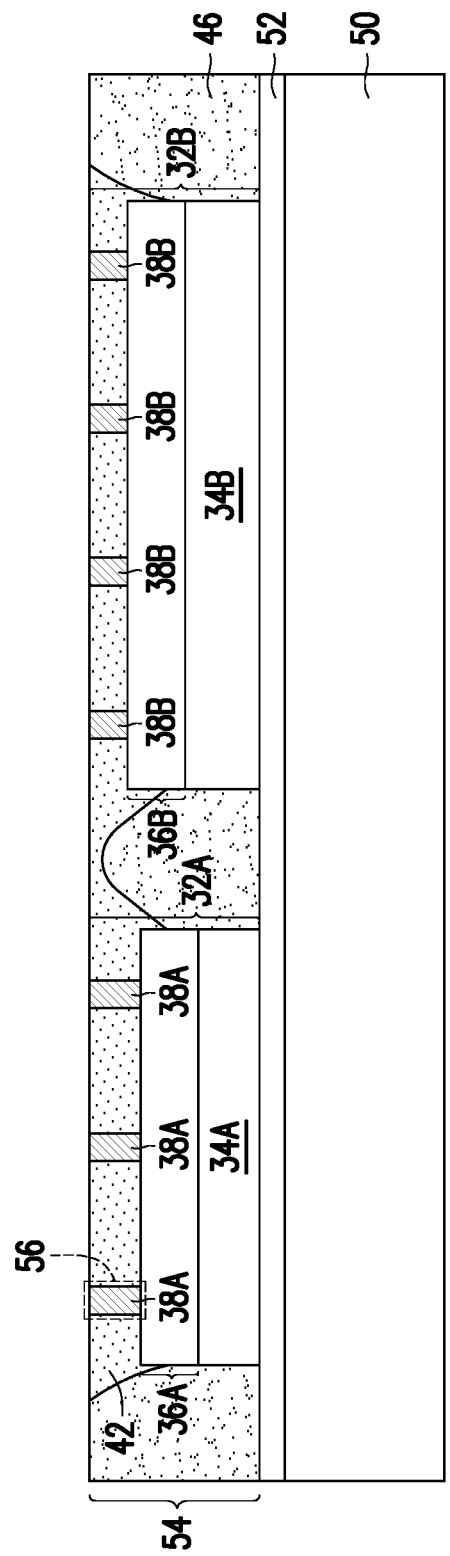
Figure 24B:
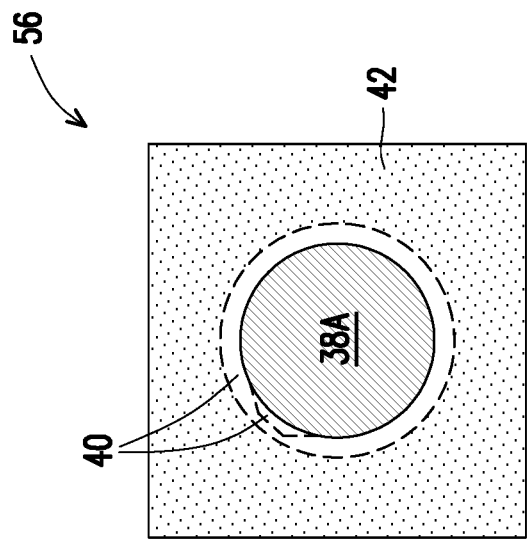
FIGS. 24A and 24B illustrate a cross-sectional view and a top view, respectively, of conductive pillars in package components and residue solder regions in accordance with some embodiments.
Figure 24A:
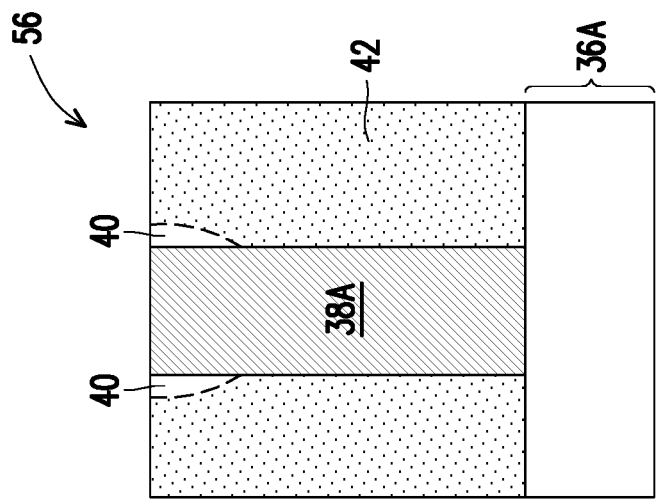

Next, a planarization step such as CMP or mechanical grinding is performed to remove metal pads 28, guiding strips 30, and solder regions 40, so that the top surfaces of conductive pillars 38 are exposed. The respective step is shown as step 216 in the process flow shown in FIG. 26. The resulting structure is shown in FIG. 8. In accordance with some embodiments of the present disclosure, all solder regions 40 are removed, and hence no residue of solder regions 40 is left in composite wafer 54. In accordance with some embodiments of the present disclosure, in the bonding of package components 32A and 32B to metal pads 28, some portions of solder regions 40 flow to the sidewalls of conductive pillars 38A and 38B. These portions of solder regions 40 may be, or may not be, left in the composite wafer 54 as shown in FIG. 8. FIG. 24A illustrates an amplified view of region 56 in FIG. 8. As shown in FIG. 24A, the residue portions of solder region 40 contact the sidewall of the top portion of conductive pillar 38A (or 38B), and does not contact the sidewall of the bottom portion of the respective conductive pillar 38A (or 38B). FIG. 24B illustrates a top view of region 56. As shown in FIG. 24B, the residue portions of solder region 40 may contact a portion of the sidewall in the top view, and does not contact the other portions. It is also possible that the residue portion of solder region 40 forms a ring encircling conductive pillar 38A (or 38B), as is shown by a dashed line. The patterns of solder region 40 are random. For example, the residue portions of solder regions 40 may be left on some of conductive pillar 38A and 38B, and not on other ones of conductive pillar 38A and 38B.

Figure 9:
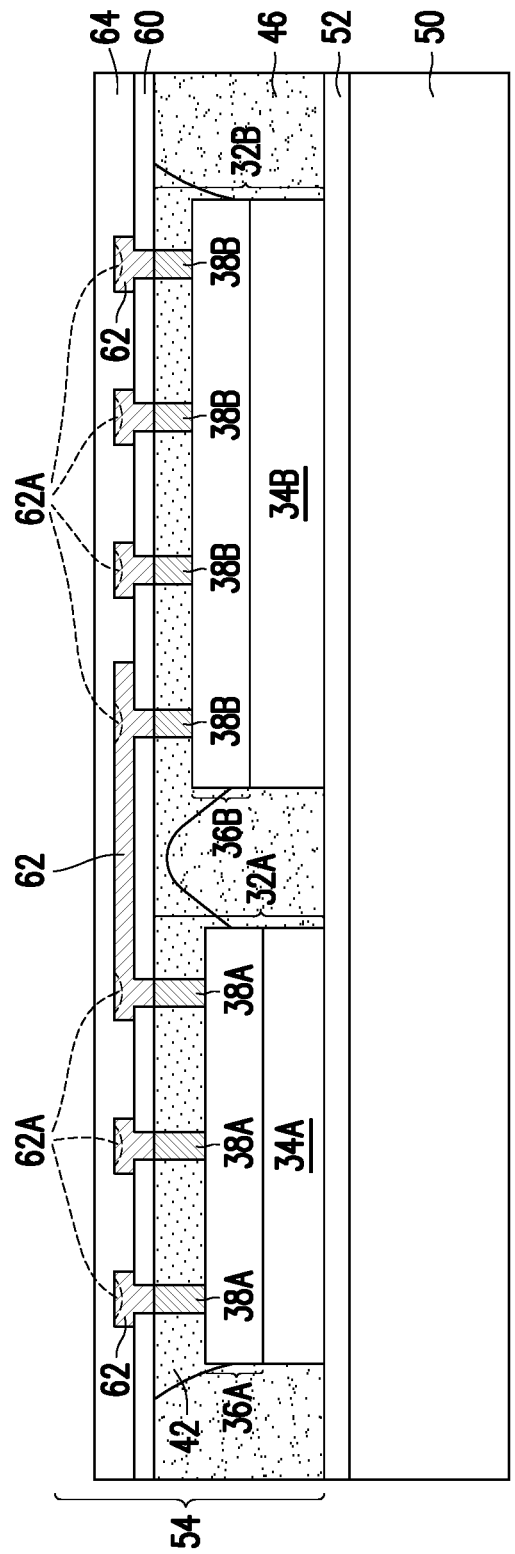

FIGS. 9 through 12 illustrate the formation of a front-side interconnect structure. The respective step is shown as step 218 in the process flow shown in FIG. 26. FIG. 9 illustrates the formation of a first layer of Redistribution Lines (RDLs) and the respective dielectric layers. Dielectric layer 60 is formed on top of package components 32A and 32B and encapsulating material 46. In accordance with some embodiments of the present disclosure, dielectric layer 60 is formed of a polymer such as PBO, polyimide, or the like. The formation method includes coating dielectric layer 60 in a flowable form, and then curing dielectric layer 60. In accordance with alternative embodiments of the present disclosure, dielectric layer 60 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings (occupied by features 62) are then formed in dielectric layer 60 to expose the underlying conductive pillars 38A and 38B, for example, through a photo lithography process. In accordance with some embodiments in which dielectric layer 60 is formed of a photo-sensitive material such as PBO or polyimide, the formation of openings involves a photo exposure using a lithography mask, and a development step.

Next, as also shown in FIG. 9, Redistribution Lines (RDLs) 62 are formed. RDLs 62 include vias extending into dielectric layer 60 to connect to conductive pillars 38A and 38B, and metal traces (metal lines) over dielectric layer 60. In accordance with some embodiments of the present disclosure, RDLs 62 are formed in a plating process, which includes depositing a metal seed layer, forming and patterning a photo resist over the metal seed layer, and plating a metallic material such as copper and/or aluminum over the metal seed layer. The metal seed layer and the plated metallic material may be formed of the same metal or different metals. The patterned photo resist is then removed, followed by etching the portions of the metal seed layer previously covered by the patterned photo resist.

Due to the plating process, the metal line portions of RDLs 62 may not be planar, and the metal line portions of RDLs 62 directly over the via portions may have recesses (dishing), as illustrated by the schematically illustrated dashed lines 62A. Furthermore, there is no distinguishable interface between the via portions and the metal line portions of RDLs 62. Although not shown, the subsequently formed RDLs 62, 66 and 70 shown in FIGS. 14 and 22 may have similar dishing, which indicate that RDLs 62, 66 and 70 are formed after the dispensing of encapsulating material 46 and underfill 42.

Dielectric layer 64 is formed over dielectric layer 60 and RDLs 62. Dielectric layer 64 may be formed using a material selected from the same candidate materials for forming dielectric layer 60, which may include PBO, polyimide, BCB, or other organic or inorganic materials.

Figure 10:
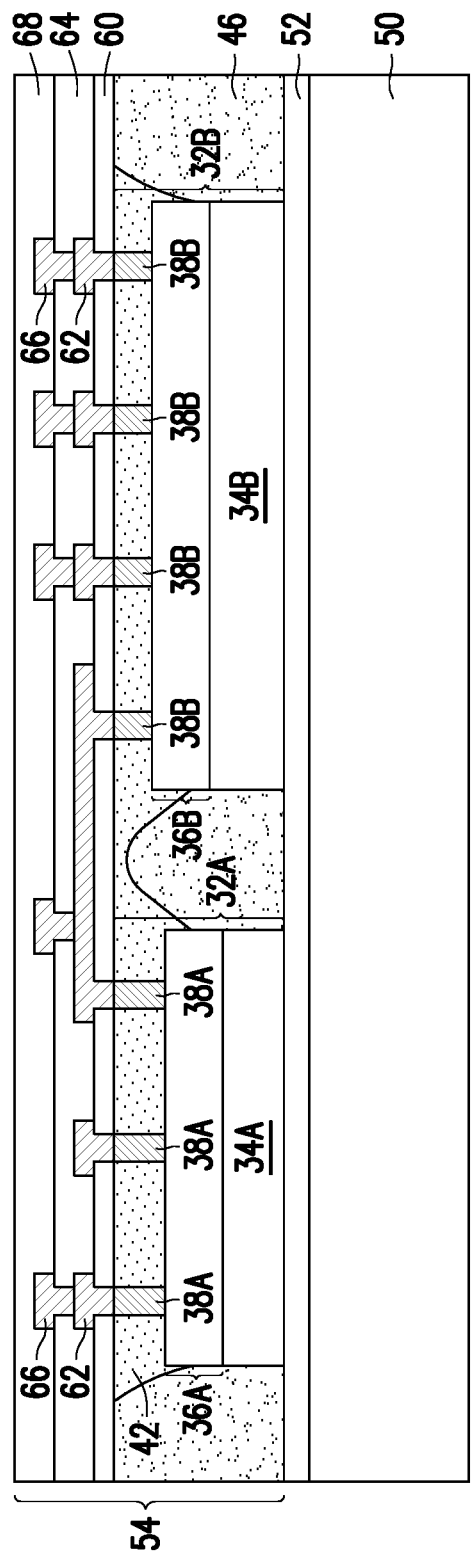

Openings may then be formed in dielectric layer 64 to expose some portions of RDLs 62. Referring to FIG. 10, RDLs 66 are formed. RDLs 66 also include via portions extending into the openings in dielectric layer 64 to contact RDLs 62, and metal line portions over dielectric layer 64. The formation of RDLs 66 may be the same as the formation of RDLs 62, which includes forming a seed layer, forming a patterned mask, plating RDLs 66, and then removing the patterned mask and undesirable portions of the seed layer. Dielectric layer 68 is then formed. Dielectric layer 68 may be formed of a material selected from the same group of candidate materials for forming dielectric layers 60 and 64.

Figure 11:
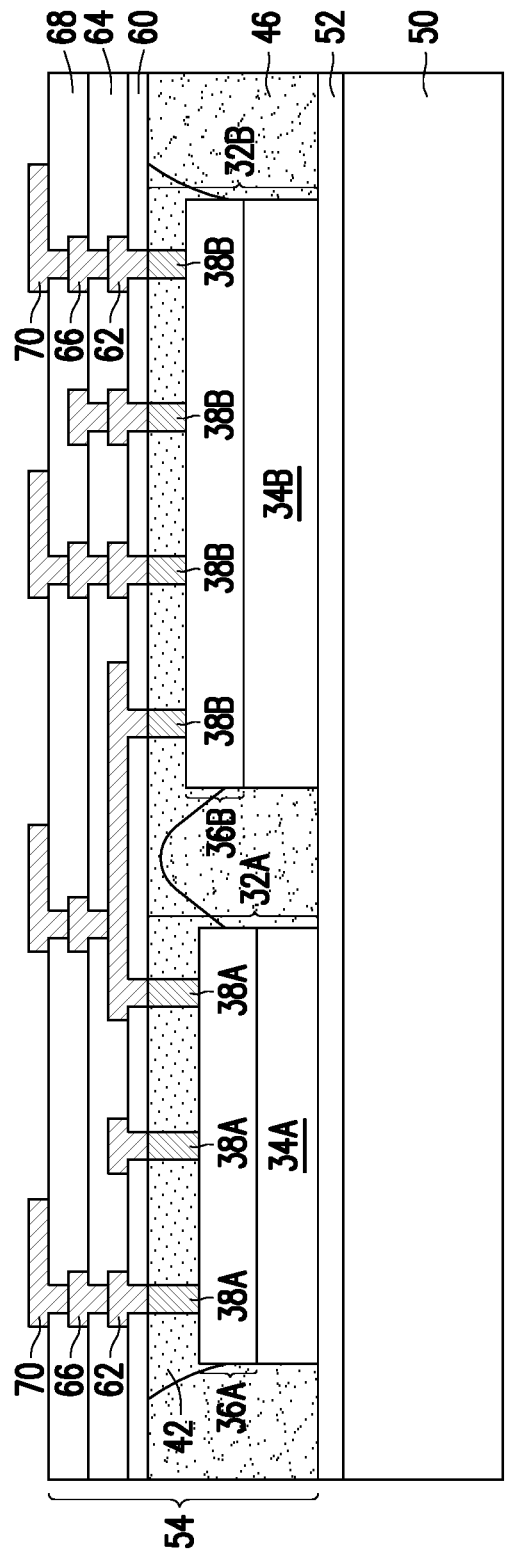

FIG. 11 illustrates the formation of RDLs 70. RDLs 70 may also be formed of a metal or a metal alloy including aluminum, copper, tungsten, or alloys thereof. It is appreciated that although in the illustrated exemplary embodiments, three layers of RDLs (62, 66 and 70) are formed, the package may have any number of RDL layers such as one layer, two layers, or more than three layers.

Figure 12:
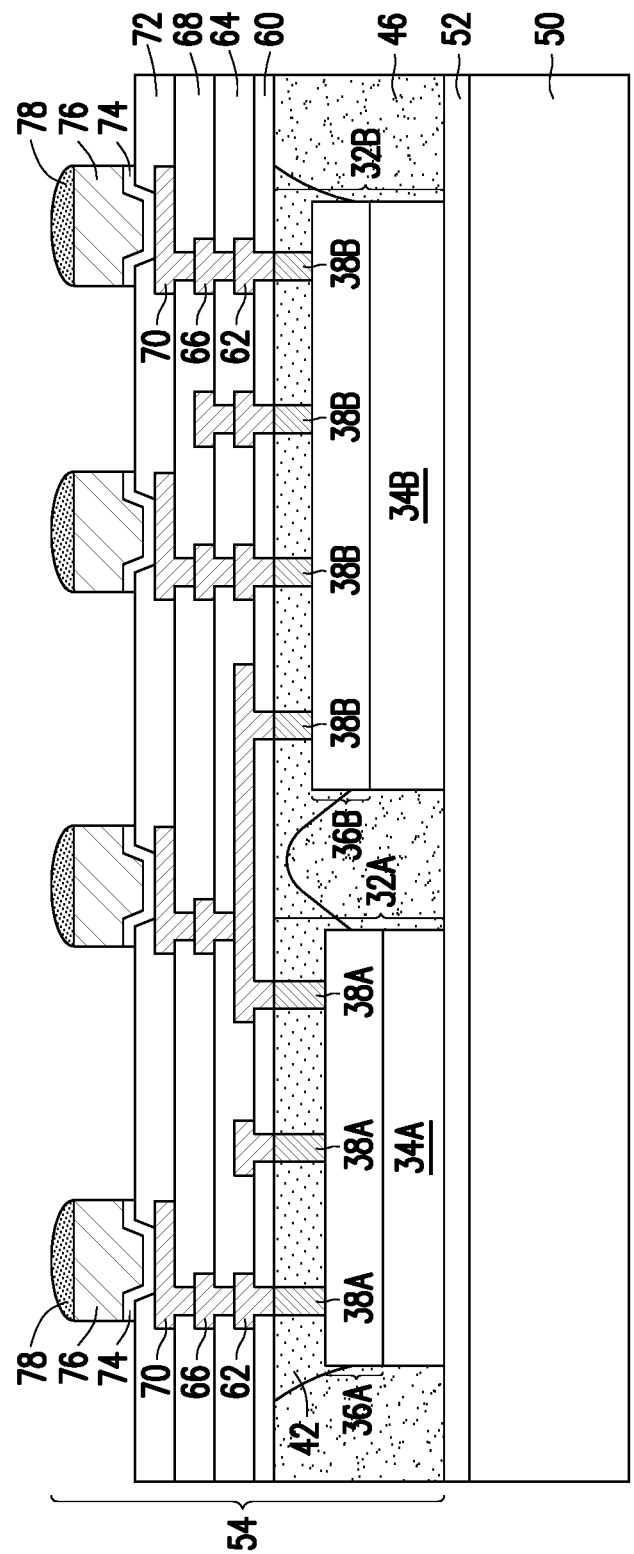

FIG. 12 illustrates the formation of dielectric layer 72, Under-Bump Metallurgies (UBMs) 74, and electrical connectors 76 in accordance with some exemplary embodiments. Dielectric layer 72 may be formed of a material selected from the same group of candidate materials for forming dielectric layers 60, 64 and 68. For example, dielectric layer 72 may be formed using PBO, polyimide, or BCB. Openings are formed in dielectric layer 72 to expose the underlying metal pads, which are parts of RDLs 70 in the illustrative exemplary embodiments. In accordance with some embodiment of the present disclosure, UBMs 74 are formed to extend into the openings in dielectric layer 72. UBMs 74 may be formed of nickel, copper, titanium, or multi-layers thereof. In accordance with some exemplary embodiments, UBMs 74 include a titanium layer and a copper layer over the titanium layer.

Electrical connectors 76 are then formed. The formation of electrical connectors 76 may include plating a non-solder (such as copper) metal pillar on the exposed portions of UBMs 74, plating a solder layer, and then reflowing the solder layer 76. In accordance with alternative embodiments of the present disclosure, the formation of electrical connectors 76 includes performing a plating step to form solder layers directly on UBMs 74, and then reflowing the solder layers.

Figure 13:
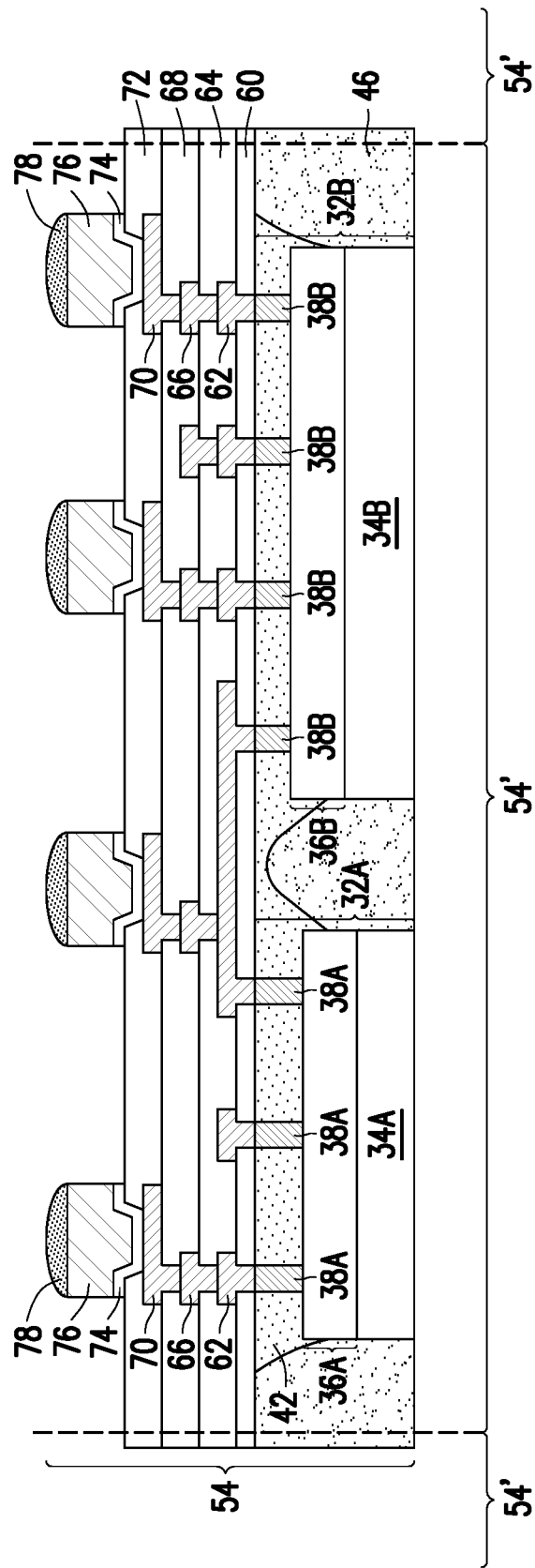

In accordance with some embodiments of the present disclosure, composite wafer 54 is de-bonded from carrier 50 (FIG. 12), with the resulting wafer 54 shown in FIG. 13. Composite wafer 54 may be attached to a dicing tape. Composite wafer 54 includes a plurality of packages 54', which are identical to each other, with each of packages 54' including package components 32A and 32B. Composite wafer 54 is then singulated into a plurality of discrete packages 54' through die-saw. The respective step is shown as step 220 in the process flow shown in FIG. 26.

Figure 14:
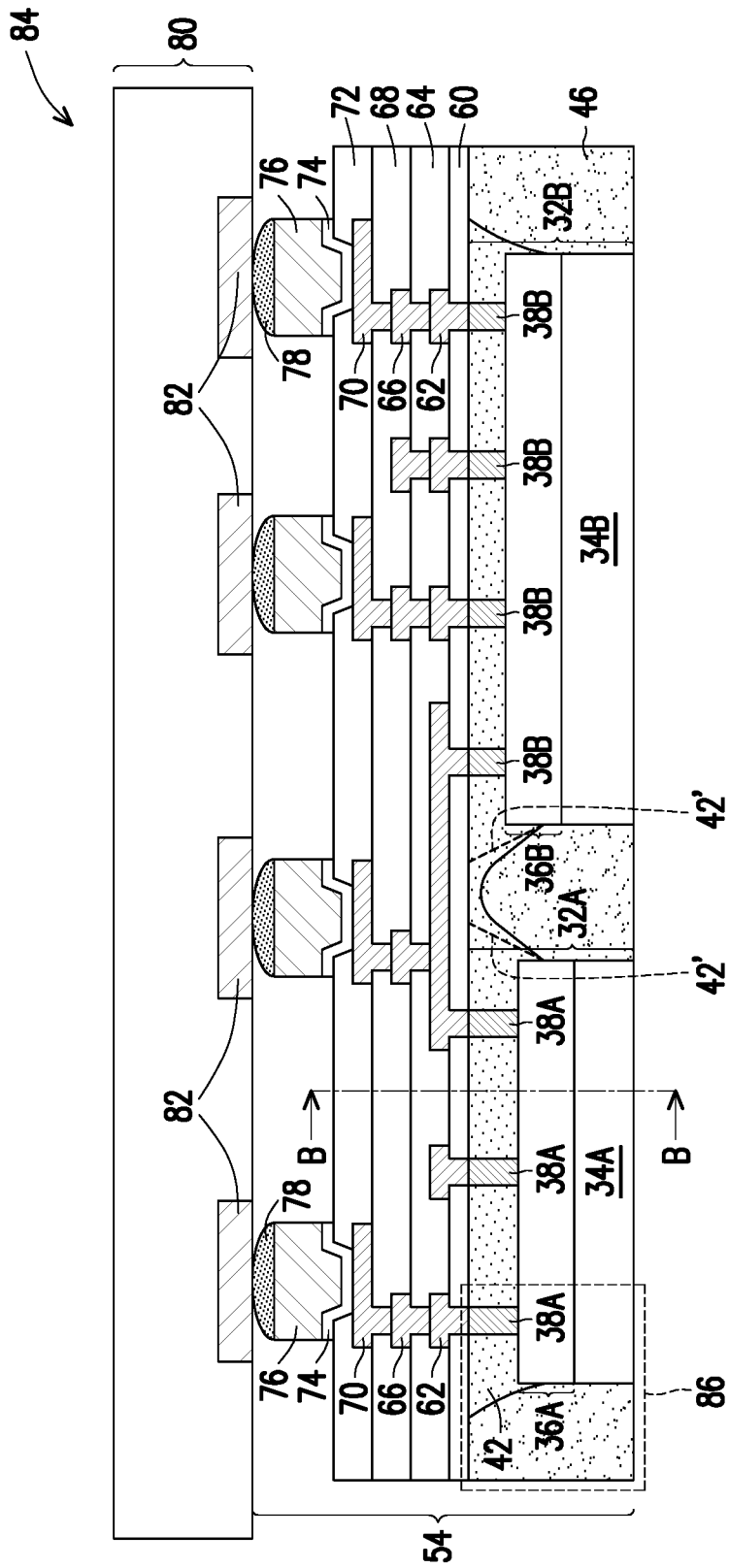

FIG. 14 illustrates the bonding of package 54' onto package component 80, thus forming package 84. The respective step is shown as step 222 in the process flow shown in FIG. 26. The bonding is performed through electrical connectors 76 and solder regions 78. In accordance with some embodiments of the present disclosure, package component 80 is a package substrate, which may be a coreless substrate or a substrate having a core. In accordance with other embodiments of the present disclosure, package component 80 includes a printed circuit board or a package.

FIG. 25 illustrates an amplified view of region 86 in package 84 as shown in FIG. 14. In accordance with some embodiments of the present disclosure, encapsulating material 46 includes base material 46A and filler particles 46B in base material 46A. Also, underfill 42 may include base material 42A and filler particles 42B in base material 42A. Filler particles 42B and 46B may have spherical shapes, and may be formed of dielectric materials such as silica. Since the portions of underfill 42 facing package components 32A and 32B (including conductive pillars 38A and 38B) are not planarized through CMP or mechanical grinding, the spherical particles 42B in contact with the illustrated top surfaced and vertical edges of package components 32A and 32B have spherical surfaces. As a comparison, the portions of encapsulating material 46 and underfill 42 in contact with dielectric layer 60 have been planarized in the step shown in FIG. 8. Accordingly, the spherical particles 42B and 46B in contact with dielectric layer 60 are partially cut during the planarization, and hence will have substantially planar top surfaces (rather than rounded top surfaces) in contact with dielectric layer 60. Inner spherical particles 42B and 46B not subjected to the planarization, on the other hand, remain to have the original shapes with non-planar (such as spherical) surfaces. Throughout the description, the particles 42B and 46B that have been polished in the planarization are referred to as partial particles. In addition, the portions of encapsulating material 46 at the bottom of package 84 have been planarized in the step shown in FIG. 6. Accordingly, the spherical particles 46B at the bottom surface of package 84 are partially cut during the planarization, and hence will have substantially planar bottom surfaces (rather than rounded bottom surfaces).

As also shown in FIG. 14, the upper portions of underfill 42 are increasingly wider than the respective underlying portions of underfill 42. In accordance with some embodiments, as shown by dashed lines 42', the planarization may cause the portion of underfill 42 adjacent to package component 32A to be disconnected from the portion of underfill 42 adjacent to package component 32B. Also, the dashed lines 42' also show what underfill 42 will look like if a cross-sectional view of underfill 42 is obtained from the plane containing line B-B in FIG. 14.

Figure 27:
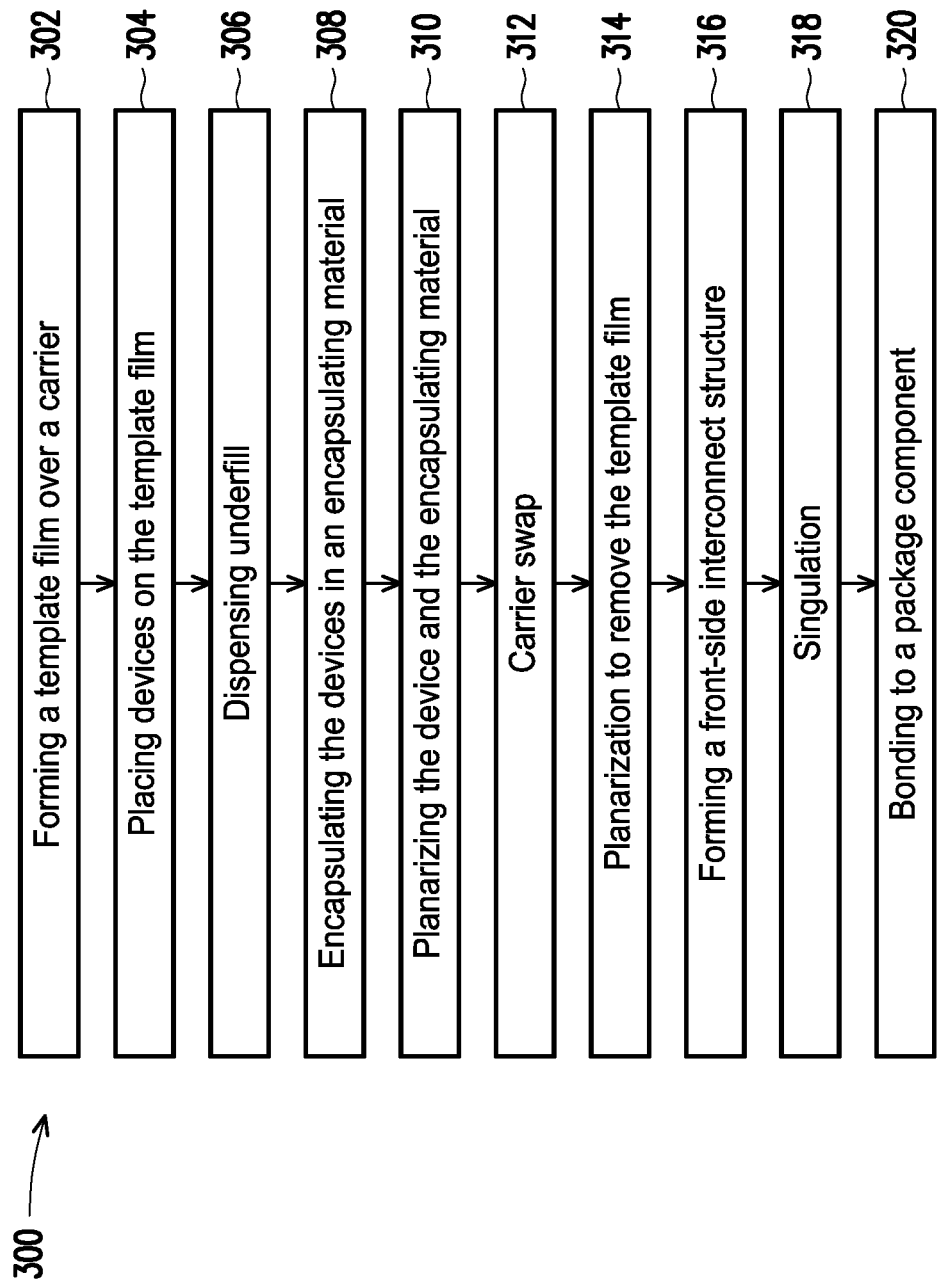

FIGS. 15 through 22 illustrate cross-sectional views of intermediate stages in the formation of an InFO package in accordance with some embodiments of the present disclosure. The steps shown in FIG. 15 through 22 are also illustrated schematically in the process flow 300 shown in FIG. 27. These embodiments are similar to the embodiments shown in FIGS. 1 through 14, except that conductive pillars of package components are inserted into a film rather than bonded on metal pads. Unless specified otherwise, the materials and the formation methods of the components in these embodiments are essentially the same as the like components, which are denoted by like reference numerals in the embodiments shown in FIGS. 1 through 14. The details regarding the formation process and the materials of the components shown in FIGS. 15 through 22 may thus be found in the discussion of the embodiments shown in FIGS. 1 through 14.

Figure 15:
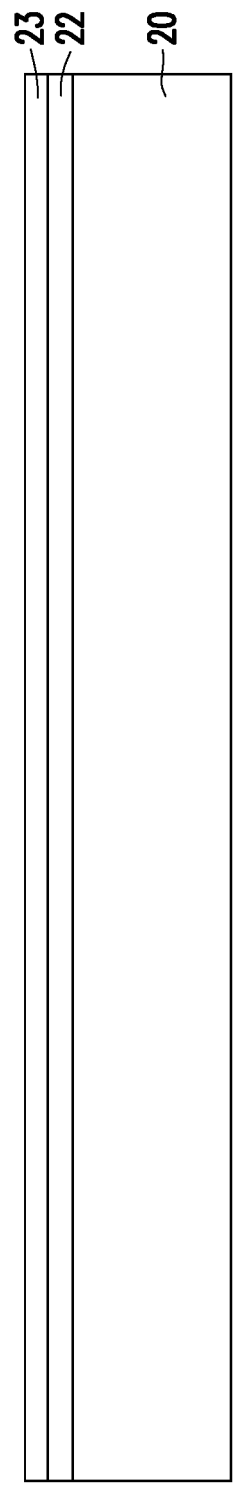
FIGS. 15 through 22 illustrate the cross-sectional views of intermediate stages in the formation of a package in accordance with some embodiments.

Referring to FIG. 15, template film 23 is formed or adhered over carrier 20. The respective step is shown as step 302 in the process flow shown in FIG. 27. Template film 23 may be a pre-formed film that is adhered over carrier 20, or may be coated over carrier 20. Template film 23 may be formed of a homogenous material free of conductive features, metal features etc. therein. Template film 23 may be formed of an adhesive film, which may be a Die-Attach film used for attaching device dies to other surfaces. In accordance with some embodiments of the present disclosure, LTHC layer 22 is coated on carrier 20, and template film 23 is formed over, and may be in contact with, LTHC layer 22. In accordance with alternative embodiments of the present disclosure, LTHC layer 22 is not formed, and template film 23 is in contact with carrier 20.

Figure 16:
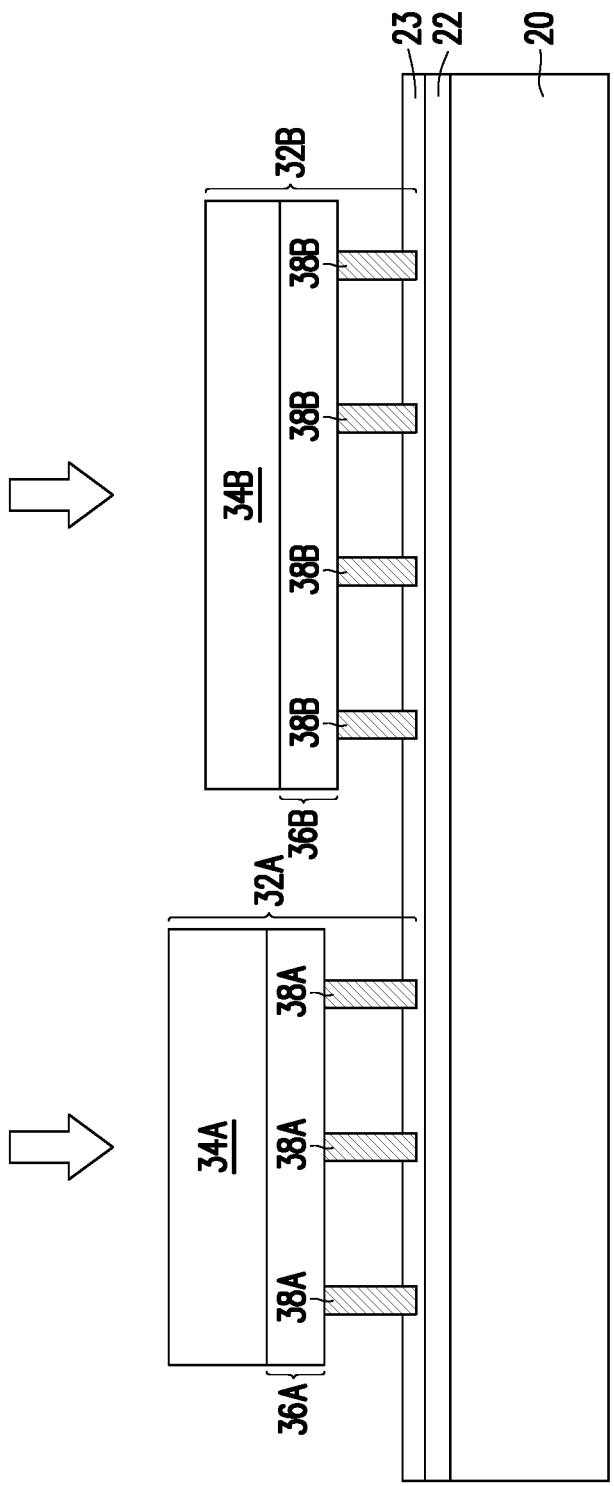

Referring to FIG. 16, package components 32A and 32B are picked and placed on template film 23. The respective step is shown as step 304 in the process flow shown in FIG. 27. Conductive pillars 38A and 38B are at least in contact with template film 23. A light force may be applied onto package components 32A and 32B, so that conductive pillars 38A and 38B extend into template film 23, so that the positions of package components 32A and 32B are fixed on template film 23. For example, conductive pillars 38A and 38B may extend into about 20 percent to about 80 percent of the thickness of template film 23. As shown in FIG. 16, the length of conductive pillars 38A may be different from the length of conductive pillars 38B. By placing package components 32A and 32B facing down, the bottom surfaces of conductive pillars 38A and 38B are aligned to substantially a same horizontal plane. In accordance with some embodiments of the present disclosure, the process step shown in FIG. 16 is at wafer level. Accordingly, there is a plurality of device groups identical to the device group including package components 32A and 32B placed on template film 23. As shown in FIG. 16, the top surfaces of package components 32A and 32B may be or may not be at the same plane.

Figure 17:
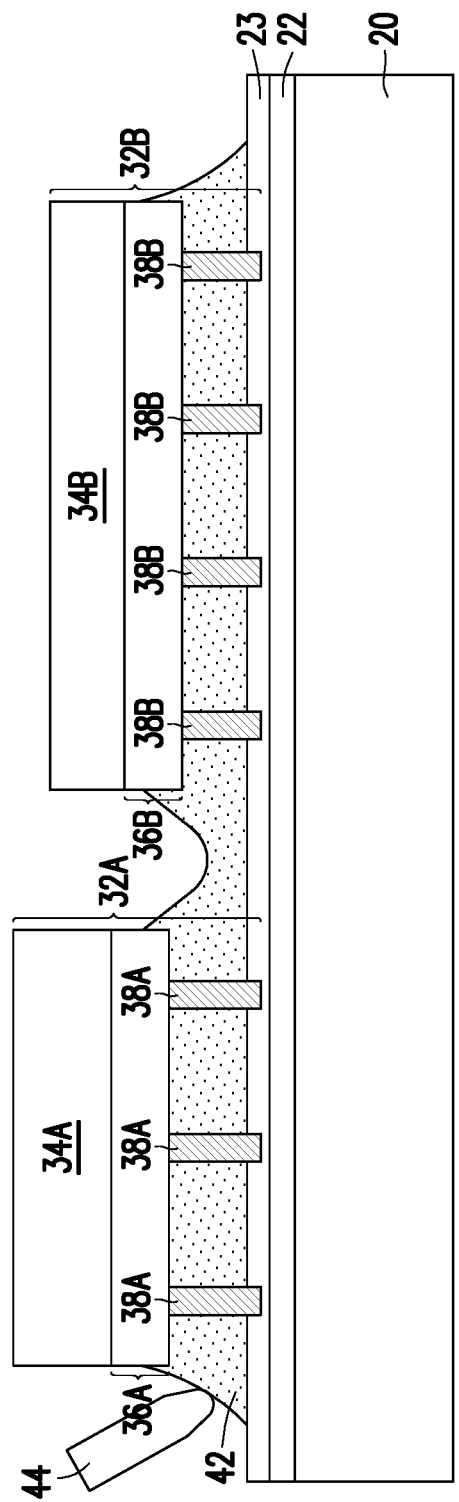

Referring to FIG. 17, underfill 42 is dispensed, for example, from one side of the device group. The respective step is shown as step 306 in the process flow shown in FIG. 27. Underfill 42 flows into the gaps between template film 23, package component 32A, and package component 32B. The material and the composition of underfill 42 may be the same as discussed for the embodiments shown in FIGS. 1 through 14, and may include base material 42A and filler particles 42B, as shown in FIG. 25.

Figure 18:
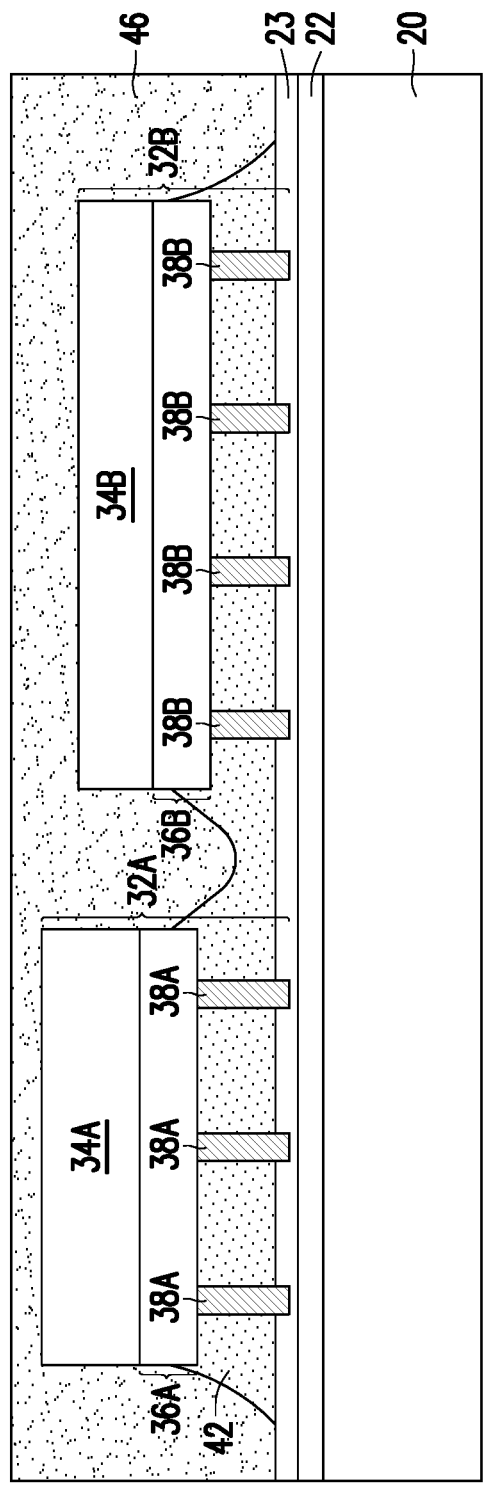

Next, package components 32A and 32B are encapsulated in encapsulating material 46, as shown in FIG. 18. The respective step is shown as step 308 in the process flow shown in FIG. 27. Encapsulating material 46 may also include a base material, which may be a polymer, a resin, an epoxy, or the like, and filler particles in the base material, which are shown as 46A and 46B, respectively, in FIG. 25.

Figure 19:
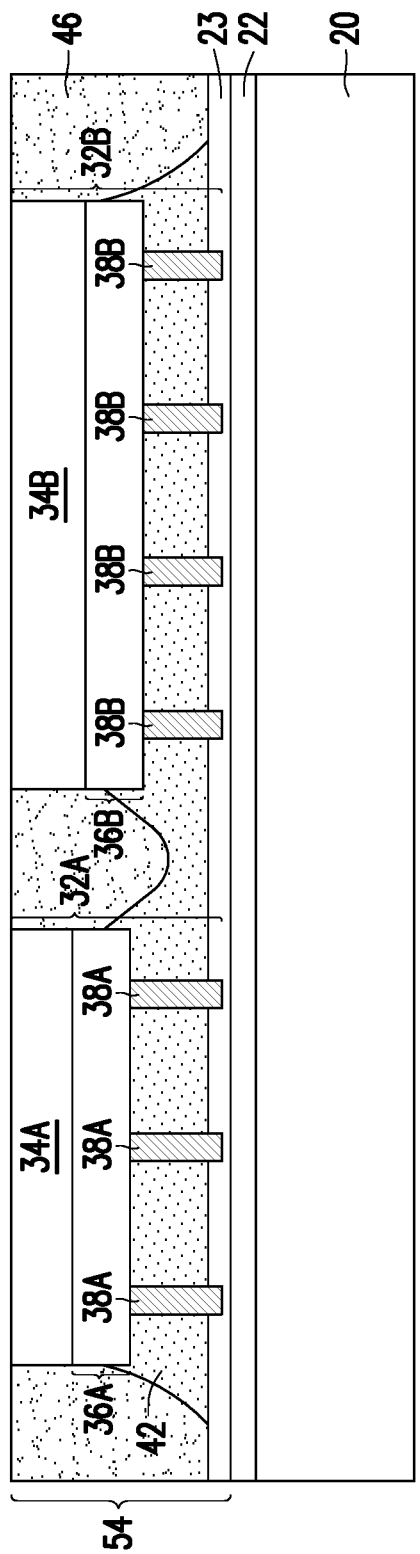

In a subsequent step, as shown in FIG. 19, a planarization step such as a CMP step or a mechanical grinding step is performed to thin encapsulating material, until one or both package components 32A and 32B are exposed. The respective step is shown as step 310 in the process flow shown in FIG. 27. In accordance with alternative embodiments, after the planarization is finished, one of package components 32A and 32B is not exposed, and is covered by a remaining layer of encapsulating material directly over it. In accordance with some embodiments of the present disclosure, substrates 34A and 34B, which may be silicon substrates, are exposed. Due to the planarization process, the top surfaces of package components 32A and 32B are substantially level (coplanar) with the top surfaces of encapsulating material 46. Composite wafer 54 is thus formed.

Figure 20:
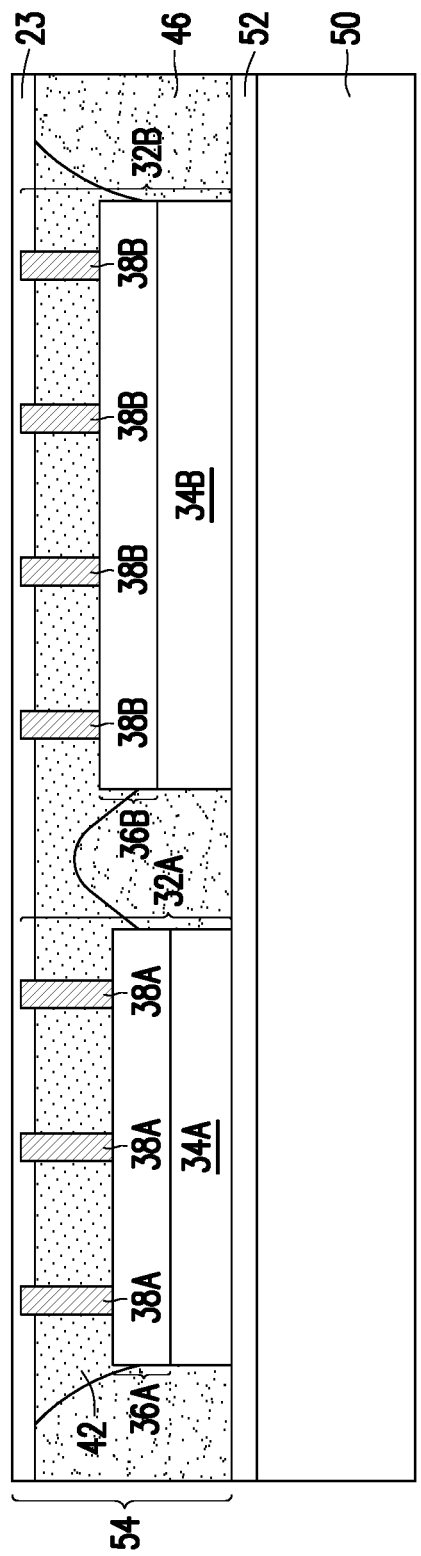
Figure 21:
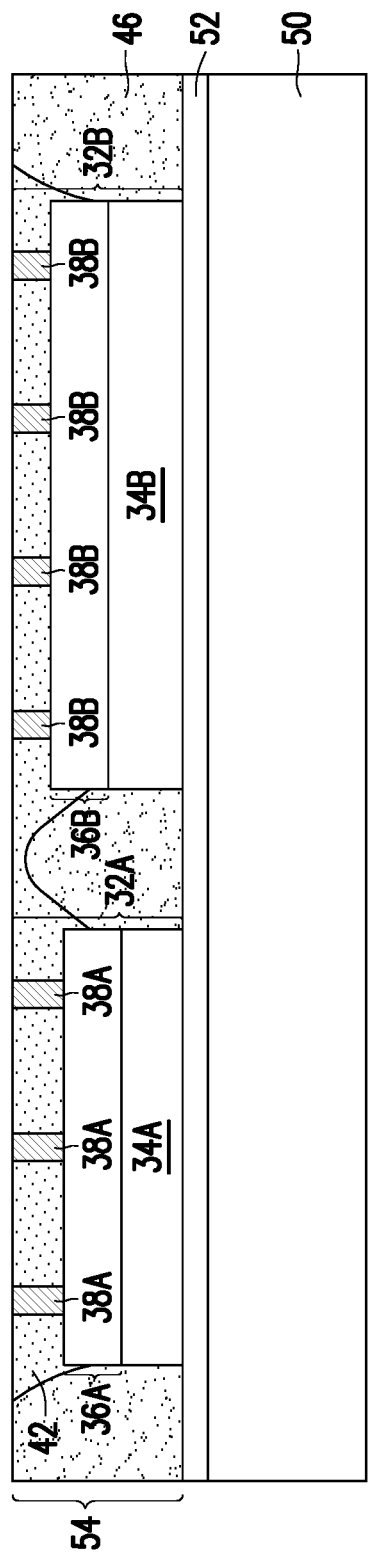

FIG. 20 illustrates a carrier swap. The respective step is shown as step 312 in the process flow shown in FIG. 27. During the carrier swap, carrier 50 is attached to the illustrated surfaces of composite wafer 54, for example, through release film 52. Carrier 50 is attached to an opposite side of composite wafer 54 than carrier 20 (FIG. 19). Next, package components 32A and 32B and encapsulating material 46 are de-bonded from carrier 20 (FIG. 19). In accordance with some embodiments of the present disclosure, the de-bonding includes decomposing LTHC layer 22, which includes projecting a heat-carrying radiation such as a laser beam on LTHC layer 22 through carrier 20. If template film 23 is directly on carrier 50, template film 23 may be formed of a thermal release film, which expands at an elevated temperature, and hence is released from carrier 20. As a result, composite wafer 54 is de-bonded (demounted) from carrier 20. The resulting structure is shown in FIG. 20.

Template film 23 may have some residue portions attached to conductive pillars 38A and 38B. Next, a planarization step such as CMP or mechanical grinding is performed to remove the residue portions of template film 23, and to planarize the surfaces of conductive pillars 38A and 38B. The respective step is shown as step 314 in the process flow shown in FIG. 27. The top surface of pillars 38A and 38B are thus coplanar with the top surfaces of encapsulating material 46 and underfill. 42.

Figure 22:
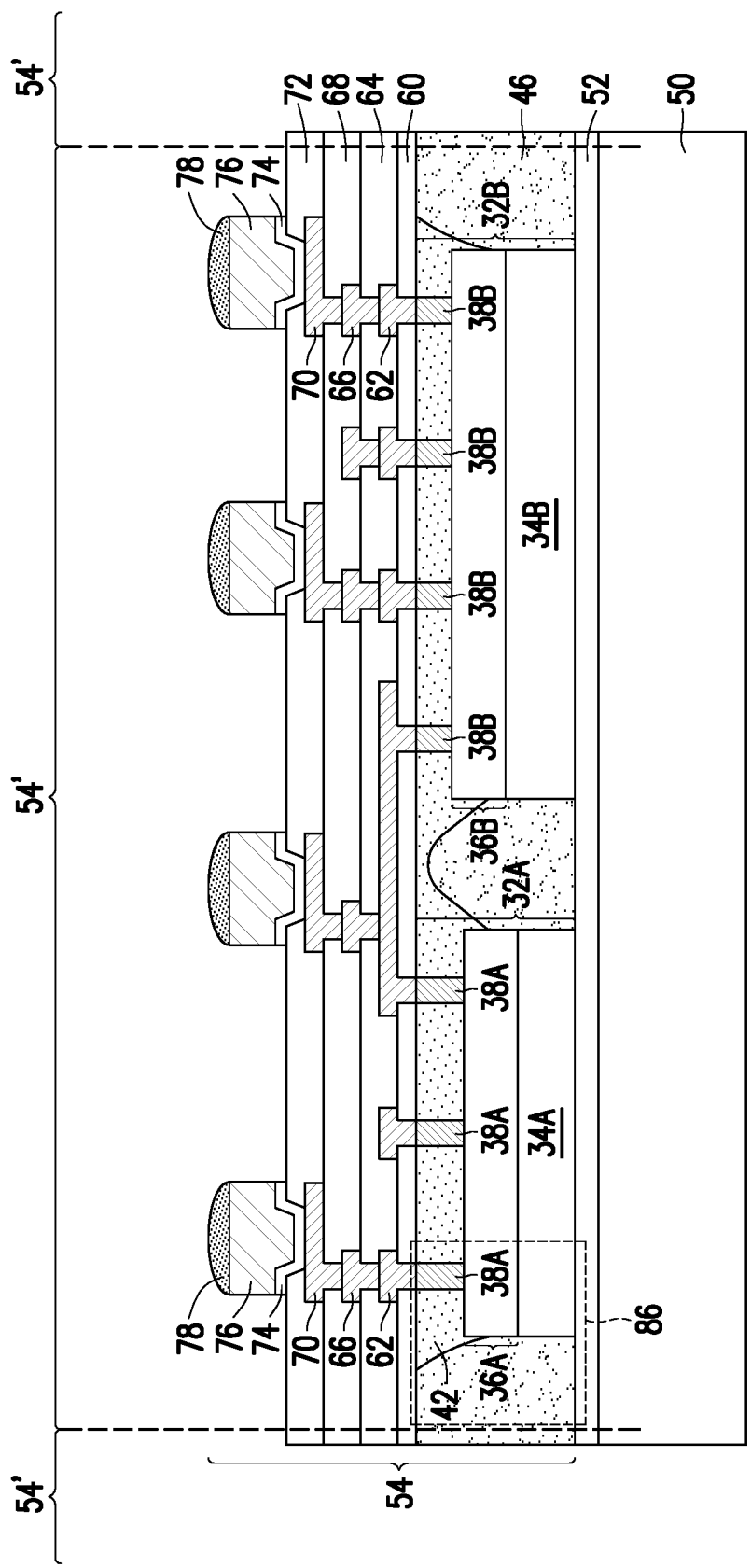

The subsequent steps are essentially the same as shown in FIGS. 9 through 13, in which the front-side interconnect structure is formed, and the resulting structure is shown in FIG. 22. The respective step is shown as step 316 in the process flow shown in FIG. 27. Composite wafer 54 as shown in FIG. 22 is similar to composite wafer 54 shown in FIG. 13, except that since no solder region has been bonded to conductive pillars 38A and 38B, there is no solder residue on the sidewalls of conductive pillars 38A and 38B. In the subsequent steps, composite wafer 54 is singulated into a plurality of identical packages 54', with one shown in FIG. 14. The respective step is shown as step 318 in the process flow shown in FIG. 27. Also, package 54' may be bonded to package component 80, and the resulting package 84 is also shown in FIG. 14. The respective step is shown as step 320 in the process flow shown in FIG. 27.

In the above-illustrated exemplary embodiments, some exemplary processes and features are discussed in accordance with some embodiments of the present disclosure.

Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In conventional InFO package formation, the back surfaces of package components (such as device dies) are attached to a release film through die-attach films, and the conductive pillars in the device dies face up. The package components are then encapsulated, and RDLs are formed to connect to the conductive pillars. It is realized that although the package components are intentionally manufactured to have the same thickness, there are process variations causing the thicknesses of package components to vary. For example, the thickness of a HBM cubes may have variation in ±25 μm. The variation causes the difficulty in the formation of RDLs. In accordance with some embodiments of the present disclosure, the conductive pillars of the package components are aligned to a same plane, either through solder bonding to metal pads or through attaching to a template film. The difference in the lengths of conductive pillars and the difference in the thicknesses of the package components are thus compensated for. The process window is thus increased.

In accordance with some embodiments of the present disclosure, a method includes placing a first package component and a second package component over a carrier, wherein first conductive pillars of the first package component and second conductive pillars of the second package component face the carrier; encapsulating the first package component and the second package component in an encapsulating material; de-bonding the first package component and the second package component from the carrier; planarizing the first conductive pillars, the second conductive pillars, and the encapsulating material; and forming redistribution lines to electrically couple to the first conductive pillars and the second conductive pillars. In an embodiment, when the encapsulating is performed, surfaces of the first conductive pillars and the second conductive pillars are aligned to substantially a same plane. In an embodiment, the method further comprises dispensing an underfill between the carrier and the first package component and between the carrier and the second package component, wherein in the planarizing, the underfill is also planarized. In an embodiment, the method further comprises forming a plurality of metal pads over the carrier; bonding the first conductive pillars and the second conductive pillars to the plurality of metal pads; and removing the plurality of metal pads from the first conductive pillars and the second conductive pillars. In an embodiment, the removing comprises performing a chemical mechanical polish or mechanical grinding on the plurality of metal pads. In an embodiment, the method further comprises forming a template film over the carrier, wherein the first conductive pillars and the second conductive pillars are inserted into the template film; and removing the template film. In an embodiment, the removing the template film comprises performing a chemical mechanical polish or mechanical grinding on the template film.

In accordance with some embodiments of the present disclosure, a method includes forming a plurality of metal pads over a carrier; bonding first conductive pillars of a first package component and second conductive pillars of a second package component to the plurality of metal pads; dispensing an underfill underlying the first package component and the second package component; encapsulating the first package component and the second package component in an encapsulating material to form a composite wafer; de-bonding the composite wafer from the carrier; and performing a first planarization on the first package component and the second package component, the underfill, and the encapsulating material to remove the plurality of metal pads. In an embodiment, the first conductive pillars and the second conductive pillars are bonded to the plurality of metal pads through solder regions. In an embodiment, after the first planarization, solder regions are removed to expose surfaces of the first conductive pillars and the second conductive pillars. In an embodiment, after the first planarization, a residue portion of the solder regions is left on a sidewall of one of the first conductive pillars and the second conductive pillars. In an embodiment, the method further comprises, before the de-bonding, performing a second planarization on the encapsulating material to expose at least one of the first package component and the second package component. In an embodiment, the method further comprises, when the plurality of metal pads is formed, forming a plurality of guiding strips, wherein the plurality of guiding strips leads underfill to flow from the first package component to the second package component. In an embodiment, the method further comprises removing the plurality of guiding strips in the first planarization.

In accordance with some embodiments of the present disclosure, a package includes a first package component and a second package component; an encapsulating material encapsulating the first package component and the second package component therein; a dielectric layer over and contacting the encapsulating material; an underfill comprising: a first portion between the first package component and the dielectric layer, wherein first conductive pillars of the first package component are in the underfill, and upper portion of the underfill are wider than lower portions of the underfill; and a second portion between the second package component and the dielectric layer, wherein second conductive pillars of the second package component are in the underfill; and redistribution lines extending into the dielectric layer to contact the first conductive pillars and the second conductive pillars. In an embodiment, the first conductive pillars and the second conductive pillars have different lengths. In an embodiment, the underfill comprises: first spherical particles; and first partial particles contacting the dielectric layer. In an embodiment, the encapsulating material comprises: second spherical particles; and second partial particles contacting the dielectric layer. In an embodiment, the first package component comprises a device die. In an embodiment, the underfill extends laterally beyond edges of the first package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of metal pads and a plurality of metal guiding strips over a carrier, wherein the plurality of guiding strips are discrete strips that are electrically decoupled from each other;
   bonding first conductive pillars of a first package component and second conductive pillars of a second package component to the plurality of metal pads;
   dispensing an underfill into a first gap between the first package component and the carrier, wherein the plurality of metal guiding strips guide the underfill to flow to a second gap between the second package component and the carrier;
   encapsulating the first package component and the second package component in an encapsulating material;
   de-bonding the first package component and the second package component from the carrier;
   after the de-bonding, removing the plurality of metal pads from the first conductive pillars and the second conductive pillars; and
   forming redistribution lines to electrically couple to the first conductive pillars and the second conductive pillars.

2. The method of claim 1, wherein during the dispensing the underfill, the plurality of metal guiding strips have first portions overlapped by the first package component, and second portions overlapped by the second package component.

3. The method of claim 1, wherein the plurality of metal guiding strips are elongated, and have lengthwise directions extending from the first package component to the second package component, and each of the plurality of metal guiding strips comprises a long sidewall and a short sidewall shorter than the long sidewall, and both of the long sidewall and the short sidewall contact the underfill to form vertical interfaces.

4. The method of claim 1, wherein the removing the plurality of metal pads comprises performing a chemical mechanical polish or mechanical grinding on the plurality of metal pads, wherein the plurality of metal guiding strips are also removed by the removing.

5. The method of claim 1, wherein when the plurality of metal pads are removed, the plurality of guiding strips are simultaneously removed.

6. The method of claim 1, wherein the plurality of guiding strips comprise copper.

7. A method comprising:
   forming a plurality of metal pads and a plurality of metal guiding strips over a carrier, wherein the plurality of metal guiding strips are elongated with lengthwise directions parallel to each other, and the plurality of metal guiding strips are electrically decoupled from each other;
   bonding first conductive pillars of a first package component and second conductive pillars of a second package component to the plurality of metal pads;
   dispensing an underfill underlying the first package component and the second package component, wherein the underfill further extends on the plurality of metal guiding strips;
   encapsulating the first package component and the second package component in an encapsulating material to form a composite wafer;
   de-bonding the composite wafer from the carrier, wherein the carrier is lifted off from the composite wafer; and
   performing a first planarization on the first package component and the second package component, the underfill, and the encapsulating material to remove the plurality of metal pads.

8. The method of claim 7, wherein the first conductive pillars and the second conductive pillars are bonded to the plurality of metal pads through solder regions.

9. The method of claim 8, wherein the underfill encircles each of the plurality of metal guiding strips.

10. The method of claim 8, wherein after the first planarization, a residue portion of the solder regions is left on a sidewall of one of the first conductive pillars and the second conductive pillars.

11. The method of claim 8 further comprising forming an additional guiding strip parallel to the plurality of guiding strips, wherein the additional guiding strip has a first end portion overlapped by the first package component, and wherein a second end portion of the additional guiding strip is spaced apart from all regions directly underlying the second package component.

12. The method of claim 7, wherein the underfill is dispensed to a first gap between the first package component and the carrier, and wherein the plurality of guiding strips guide the underfill to flow from the first gap to a second gap between the second package component and the carrier.

13. The method of claim 7 further comprising removing the plurality of guiding strips in the first planarization.

14. The method of claim 7, wherein the plurality of guiding strips are discrete metal strips that are separated from each other.

15. A method comprising:
   depositing a metal layer over a carrier;
   patterning the metal layer into a first plurality of metal pads, a second plurality of metal pads, and a metal strip between the first plurality of metal pads and the second plurality of metal pads;
   bonding first conductive pillars of a first package component and second conductive pillars of a second package component to the first plurality of metal pads and the second plurality of metal pads, respectively;
   planarizing back surfaces of the first package component and the second package component to align to a same plane;
   removing the first plurality of metal pads, the second plurality of metal pads, and the metal strip; and
   forming redistribution lines to electrically connect to the first conductive pillars and the second conductive pillars.

16. The method of claim 15 further comprising dispensing an underfill between the first package component and the carrier, wherein the metal strip guides the underfill to flow from the first package component to the second package component.

17. The method of claim 16 further comprising, after the first package component and the second package component are bonded:
   projecting light to decompose a release film that is attached to the carrier;
   lifting off the carrier to reveal the first plurality of metal pads and the second plurality of metal pads; and
   polishing to remove the first plurality of metal pads, the second plurality of metal pads, and the metal strip.

18. The method of claim 16, wherein the metal strip comprises a long sidewall and a short sidewall shorter than the long sidewall, and both of the long sidewall and the short sidewall contact the underfill to form vertical interfaces.

19. The method of claim 18, wherein the vertical interfaces are joined to form a full interface ring.

20. The method of claim 16 further comprises an additional metal strip parallel to the metal strip, wherein the underfill encircles each of the metal strip and the additional metal strip.

* * * * *